(12) United States Patent
Guo

(10) Patent No.: US 9,054,301 B2
(45) Date of Patent: Jun. 9, 2015

(54) METHOD OF MAKING AN INTEGRATED DEVICE USING OXYGEN ION IMPLANTATION

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/251,576

(22) Filed: Apr. 12, 2014

(65) Prior Publication Data

US 2014/0306304 A1    Oct. 16, 2014

Related U.S. Application Data

(60) Provisional application No. 61/812,238, filed on Apr. 15, 2013.

(51) Int. Cl.
*H01L 43/02* (2006.01)
*H01L 43/12* (2006.01)
*H01L 27/22* (2006.01)

(52) U.S. Cl.
CPC .............. *H01L 43/12* (2013.01); *H01L 27/222* (2013.01)

(58) Field of Classification Search
CPC .............................. H01L 43/12; H01L 27/222
See application file for complete search history.

(56) References Cited

U.S. PATENT DOCUMENTS

2013/0288393 A1\* 10/2013 Hautala ............................. 438/3
2013/0288394 A1\* 10/2013 Kontos et al. .................... 438/3

\* cited by examiner

*Primary Examiner* — Long Pham

(57) ABSTRACT

A method to make magnetic random access memory (MRAM), or integrated device in general, is provided. Oxygen ion implantation is used to convert the photolithography exposed areas into metal oxide dielectric matrix. To confine the oxygen ions within the desired region, heavy metals with large atomic number, such as Hf, Ta, W, Re, Os, Ir, Pt, Au is used as ion mask and bottom ion-stopping layer. An oxygen gettering material, selected from Mg, Zr, Y, Th, Ti, Al, Ba is added above and below the active device region to effectively capture the impinging oxygen. After a high temperature anneal, a buried metal oxide layer with sharp oxygen boundaries across the active device region can be obtained.

19 Claims, 3 Drawing Sheets

METHOD OF MAKING AN INTEGRATED DEVICE USING OXYGEN ION IMPLANTATION

RELATED APPLICATIONS

This application claims the priority benefit of U.S. Provisional Application No. 61/812,238 filed on Apr. 15, 2013, which is incorporated herein by reference.

BACKGROUND OF THE INVENTION

1. Field of the Invention

This invention relates generally to spin-electronic devices, more particularly to a magnetic tunnel junction and methods for making the same.

2. Description of the Related Art

Magnetoresistive elements having magnetic tunnel junctions (also called MTJs) have been used as magnetic sensing elements for years. In recent years, magnetic random access memories (hereinafter referred to as MRAMs) using the magnetoresistive effect of MTJ have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong magnetic crystalline anisotropy, shape anisotropies are not used, and accordingly, the device shape can be made smaller than that of an in-plane magnetization type. Also, variance in the easy axis of magnetization can be made smaller. Accordingly, by using a material having a large magnetic crystalline anisotropy, both miniaturization and lower currents can be expected to be achieved while a thermal disturbance resistance is maintained.

There has been a known technique for achieving a high MR ratio in a perpendicular magnetoresistive element by forming a crystallization acceleration film that accelerates crystallization and is in contact with an interfacial magnetic film having an amorphous structure. As the crystallization acceleration film is formed, crystallization is accelerated from the tunnel barrier layer side, and the interfaces with the tunnel barrier layer and the interfacial magnetic film are matched to each other. By using this technique, a high MR ratio can be achieved. However, where a MTJ is formed as a device of a perpendicular magnetization type, the materials of the recording layer typically used in an in-plane MTJ for both high MR and low damping constant as required by low write current application normally don't have enough magnetic crystalline anisotropy to achieve thermally stable perpendicular magnetization against its demagnetization field. In order to obtain perpendicular magnetization with enough thermal stability, the recording layer has to be ferromagnetic coupled to additional perpendicular magnetization layer, such as TbCoFe, or CoPt, or multilayer such as (Co/Pt)n, to obtain enough perpendicular anisotropy. Doing so, reduction in write current becomes difficult due to the fact that damping constant increases from the additional perpendicular magnetization layer and its associated seed layer for crystal matching and material diffusion during the heat treatment in the device manufacturing process.

In a spin-injection MRAM using a perpendicular magnetization film, a write current is proportional to the perpendicular anisotropy, the damping constant and inversely proportional to a spin polarization, and increases in proportional to a square of an area size. Therefore, reduction of an area size is mandatory technologies to reduce the write current.

Besides a write current, the stability of the magnetic orientation in a MRAM cell as another critical parameter has to be kept high enough for a good data retention, and is typically characterized by the so-called thermal factor which is proportional to the perpendicular anisotropy as well as the volume of the recording layer cell size. Although a high perpendicular anisotropy is preferred in term of a high thermal disturbance resistance, an increased write current is expected as a cost.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

In the mean time, since the switching current requirements reduce with decreasing MTJ element dimensions, STT-MRAM has the potential to scale nicely at even the most advanced technology nodes. However, making of small MTJ element leads to increasing variability in MTJ resistance and sustaining relatively high switching current or recording voltage variation in a STT-MRAM.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ. Majorities of cell-to-cell variations come from the MTJ cell patterning process.

The MTJ patterning process becomes one of the most challenging aspects of manufacturing. Conventional techniques utilized to pattern small dimensions in a chip, such as ion milling etching (IBE) or reactive ion etching (RIE), having been less than satisfactory when applied to magnetic tunnel junction stacks used for MRAM. In most cases when these techniques are used, it is very difficult or almost impossible to cleanly remove etched materials without partial damages to magnetic tunnel junction properties and electric current shunting. In a RIE etching of magnetic material, physical sputtering is still the major component which unavoidable results in the formation of re-deposited residues that can short circuit the junctions of the MTJ or create shunting channel of the MTJ, yielding high resistance variations and serious reliability issues.

Another problem of conventional patterning techniques is the degradation of the recording layer and reference layer in the MTJ, due to corrosion caused by chemical residue remaining after etching. Exposure to reactive gases during refilling deposition of dielectrics such as silicon dioxide or silicon nitride after the MTJ etching can also cause corrosion. After refilling of dielectric material, a chemical mechanic polishing process is required to smooth out the top surface for bit line fabrication, which introduces a big manufacturing challenging as well as high cost and further corrosion.

The current fabrication method to form STT-MRAM is by etching and dielectric refilling. Due to the non-volatile nature of the etched magnetic materials, the sensor profile is typically sloped with small top (230) and large bottom (210, FIG. 2, prior art). As the result, the formed sensor size cannot be made small enough to reduce the current for information writing. Often the etched sensor edge got damaged with electrical shorting across the MgO barrier (220).

Thus, it is desirable to provide a greatly improved method or innovative method that enables well-controllable and low cost fabrication in MTJ patterning while eliminating damage, degradation and corrosion.

BRIEF SUMMARY OF THE PRESENT INVENTION

The present invention is to make magnetic random access memory (MRAM), or integrated device in general. Oxygen ion implantation is used to convert the photolithography exposed areas into metal oxide dielectric matrix. To confine the oxygen ions within the desired region, heavy metals with large atomic number, such as Hf, Ta, W, Re, Os, Ir, Pt, Au is used as ion mask and bottom ion-stopping layer. An oxygen gettering material, selected from Mg, Zr, Y, Th, Ti, Al, Ba is added above and below the active device region to effectively capture the impinging oxygen. After a high temperature anneal, a buried metal oxide layer with sharp oxygen boundaries across the active device region can be obtained.

According to the current invention, an MTJ stack is formed on a substrate, the MTJ consists of a recording layer, a reference layer and a MgO tunnel barrier layer disposed between the recording layer and the reference layer, a protective cap layer and an optional MgO intermediate layer provided on a surface of the recording layer, which is opposite to a surface of the recording layer where the tunnel barrier layer is provided, and there is provided a method of patterning a magnetic tunnel junction which comprises:

forming an ion implantation hard mask in the first direction on the cap layer;
ion-implanting oxygen atoms into the entire film stack from a surface exposed in the opening of the mask;
forming an ion implantation hard mask in the second direction on the cap layer;
ion-implanting oxygen atoms into the entire film stack from a surface exposed in the opening of the mask in the second direction;

carrying out a thermal annealing with respect to the substrate to oxidize an ion implantation region and re-crystallized MgO layer so that a highly oxidized MgO layer having a greatly increased resistance is formed and an oxidized recording layer having a highly increased resistance and zero or near zero magnetization moment is formed in the opening of the mask; and forming a dielectric region outside of the photo-mask on the substrate and a functional magnetoresistive element underneath the photo-mask on the substrate.

DETAILED DESCRIPTION OF THE INVENTION

Figure 1:
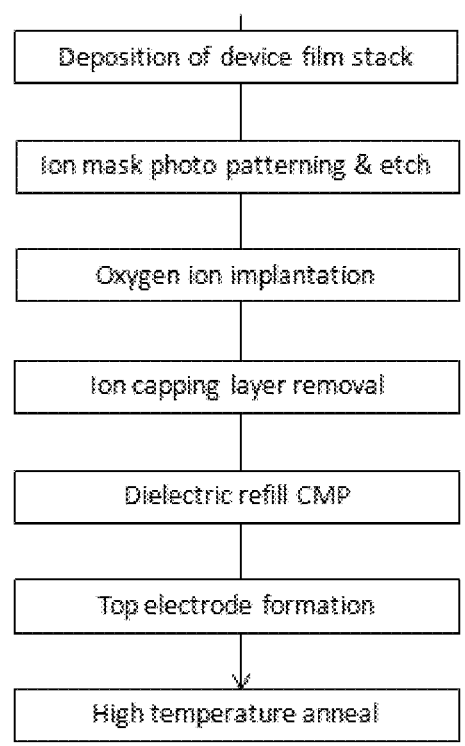
FIG. 1 Process flow chart of the invention.
Figure 2:
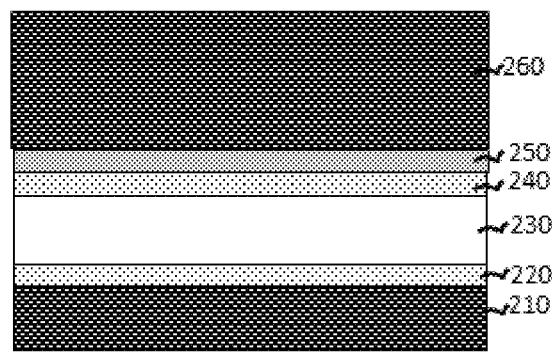
FIG. 2 Device film stack is deposited.

Here we use oxygen ion implantation to convert the photolithography exposed areas into metal oxide thus forming an electric insulating dielectric matrix. The process flow is shown in FIG. 1. The first operation is to deposit device film stack on a Si substrate which may already contains CMOS control circuits. In general, the process described here can be used to make any type of integrated devices, such as diodes, FETs, and various RAMs including MRAM. The film (FIG. 2) stack contains several key layers, a bottom ion-stopping layer (210), an oxygen gettering layer (220), a device layer (230) which could contains a series of sub-layers, another oxygen gettering layer (240), an ion-capping layer (250), and an ion-mask layer (260).

The ion-stopping layer (210) typically contains a heavy metal with large atomic number, selected from Hf, Ta, W, Re, Os, Ir, Pt, Au, with a thickness between 200 A-1000 A. Pt or Au is superior to other materials because of their resistance to oxygen oxidation. The oxygen gettering layer (220 & 240) typically contains a material selected among Mg, Zr, Y, Th, Ti, Al, Ba above and below the active device region (230) to effectively capture oxygen ions during oxygen ion implantation.

For magnetic random access memory application, Mg is preferred due to its close lattice constant match with CoFe. The thickness of the oxygen gettering layer (220), (240) is typically about 50 A-100 A. The device region (230), such as for perpendicular spin transfer torque memory random access memory (pSTT-MRAM), typically contains three key sub-layers: CoFeB memory layer with a thickness between 10 A-30 A, MgO dielectric tunneling layer with a thickness between 8-15 A, and a magnetic reference layer made from a hard magnetic materials, CoPt, CoPd, CoTb, FePt, FePd, FeTb or Co/Pt, Co/Pd, Fe/Pt, FePd multilayer with a total thickness between 30 A-80 A. The ion-capping layer (250) has two functions: first to prevent oxygen ions backing-off during oxygen ion implantation and, second to act as a reactive ion etch (RIE) stopping layer for the formation of the top ion-mask layer (260). The ion-capping layer can be selected from Ru, Cu, Al, Cr with a thickness between 100 A-300 A. The top ion-mask layer (260), in general, uses the same material as the bottom ion-stopping layer (210), such as Hf, Ta, W, Re, Os, Ir, Pt, Au. For MRAM, Ta is preferred because of its ease in CF4 RIE process during the mask formation.

Figure 3:
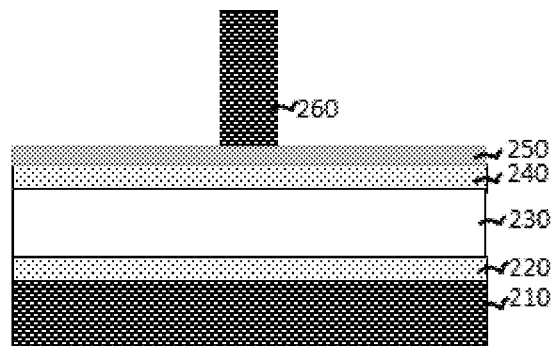
FIG. 3 Ion mask is formed after photolithography patterning and etch.

After the film deposition, a photolithography patterning is performed, which can be either one patterning or dual patterning and process (refer to our earlier dual pattern patent application). The patterned wafer is then RIE etched to remove the exposed mask material. For Ta ion mask, typical etchant is CF4 or CF3H or other C,F,H containing gases. The etching is stopped on top of the ion-capping layer (250). Then oxygen plasma is used to remove the remaining photoresist and etchant re-dep. The formed ion-mask (260) is shown in FIG. 3.

Figure 4:
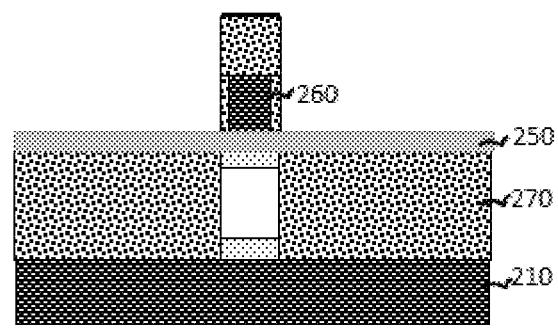
FIG. 4 Oxygen ions are implanted into the desired region.

Then immediately followed by an oxygen ion implantation to add oxygen into the device layer (230). Due to presence of ion stopping layer (210), oxygen ions are mainly captured by the two oxygen gettering layers (220 & 240) redistributed into the device layer (230) forming a new metal oxide dielectric layer (270) with an uniform oxygen re-distribution across it after a high temperature anneal. In the mean time, the top portion of the ion-mask layer (260) is also oxidized as shown in FIG. 4.

Figure 5:
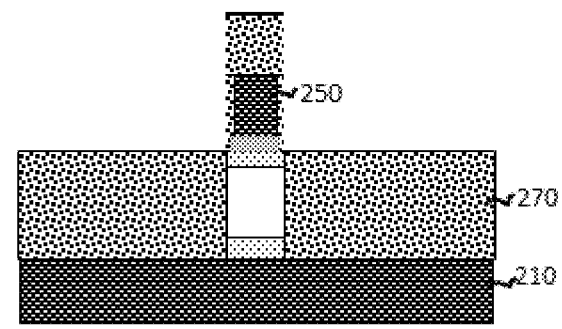
FIG. 5 Ion capping layer is removed from the exposed region.

Then an etching process is used to remove the exposed portion of the ion-capping layer using CH3OH, or CO & NH4 to prevent electric shorting within the IC device. The etching is stopped on the top surface of oxide layer 270 (FIG. 5).

Figure 6:
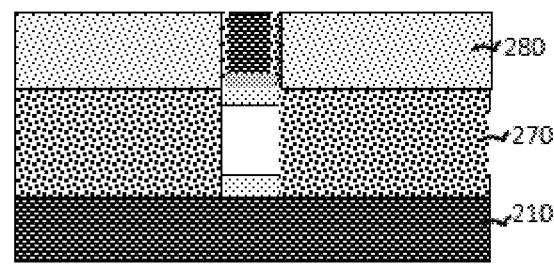
FIG. 6 Device after dielectric refill and CMP.

Then a dielectric SiO2, SiNx or Al2O3 layer (280) is refilled on the etched portion of the device and a chemical mechanic polishing (CMP) is used to flatten the wafer surfaceand also remove the top portion of the oxidized ion-mask layer (250) (see FIG. 6).

Figure 7:
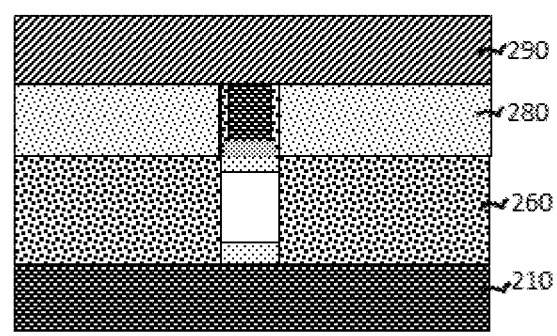
FIG. 7 Device after a top metallic lead is formed.

Then a top metallic film stack (290) is deposited and subsequently patterned to form top electrode (FIG. 7), which can be a single metallic layer of Ru, Cu, Al or alloy of them or sandwiched between two Ta layers, with a thickness of 500 to 1000 A.

The wafer is finally annealed at high temperature between 250 C to 500 C for a time between 30 sec to 30 minutes to activate the oxygen-metallic bonding for form metal oxide electrically insulating dielectric matrix and also to repair the damage from oxygen ion implantation.

The invention claimed is:

1. A method of making an integrated device or an integrated circuit (IC) device such as a perpendicular spin torque transfer magnetic random access memory (pSTT-MRAM) using oxygen ion implantation, comprising
    making an ion implantation stopping layer;
    making an oxygen gettering layer;
    making an active device layer;
    making a second oxygen gettering layer;
    making an ion-capping layer; and
    making an ion-mask layer.

2. The method of claim 1, wherein making said ion implantation stopping layer comprising making a layer with element Hf, Ta, W, Re, Os, Ir, Pt, or Au with a thickness between 200Å and 500Å preferably Pt or Au for their superior oxidation resistance.

3. The method of claim 1, wherein making said oxygen gettering layer comprising making a layer with element Mg, Zr, Y, Th, Ti, Al, or Ba with a thickness between 20Å and 100Å preferably Mg for making an MRAM device due to that its oxide (MgO) has a close lattice match with CoFe and CoFeB.

4. The method of claim 1, wherein making said pSTT-MRAM comprising making a CoFeB memory layer with a thickness between 10Å and 30Å, an MgO dielectric tunneling layer with a thickness between 8Å and 15Å, and a magnetic reference layer of CoPt, CoPd, CoTb, FePt, FePd, FeTb, Co/Pt, Co/Pd, Fe/Pt, or FePd multilayer with a total thickness between 30Å and 80Å.

5. The method of claim 1, wherein making said ion-capping layer comprising making a layer with element Ru, Cu, Al, or Cr with a thickness between 100Å and 300Å preferably Ru for making a MRAM device.

6. The of claim 1, wherein making said IC device comprising making a photo-lithographically patterned film stack for making a patterned IC device.

7. The method of claim 6, wherein making said photo-lithographically patterned film stack further comprising making an exposed ion mask region in the patterned IC device and said exposed ion mask region further comprising being etched for making an etched ion mask.

8. The method of claim 7, wherein making said etched ion-mask comprising using element Ta and said etching process comprising using gas of CF4 or CF3H or other gas(es) comprising element C, F, or H, as an etchant(s), wherein said etching is stopped on top of the ion-capping layer.

9. The of claim 7, wherein making said etched ion-mask further comprising removing the remained photoresistance and redep by oxygen burring.

10. The method of claim 6, wherein making said patterned IC device comprising an oxygen ion implantation with a certain ion dose and implanting energy to impinge the oxygen ions into the active device region.

11. The method of claim 10, wherein said process of implanting oxygen ions into the active device region comprising having impinged oxygen ions being blocked by the ion implantation stopping layer.

12. The method of claim 10, wherein said process of implanting oxygen ions into the active device region comprising having impinged oxygen ions being captured by oxygen gettering layers below and above the device region for making an oxygen ion-implanted device wafer.

13. The method of claim 12, wherein making an oxygen ion-implanted device wafer further comprising having the exposed ion-capping layer being removed by an etching process.

14. The method of claim 12, wherein making said oxygen ion-implanted device wafer comprising using element Ru and wherein etching comprising using gas of CH3OH or CO or NH4, as an etchant(s).

15. The method of claim 14, wherein making said oxygen ion-implanted device wafer further comprising having etched-out spaces being refilled with SiO2, SiNx, or AlOx dielectrics.

16. The method of claim 15, wherein making said oxygen ion-implanted device wafer further comprising being chemically mechanically polished to flatten the surface and to remove the top portion of the oxidized ion-mask.

17. The method of claim 16, wherein making said oxygen ion-implanted device wafer further comprising being deposited with a metallic electrode layer comprising element Ru, Cu, or Al, or alloy of them or being sandwiched between two Ta layers, such as Ta/Ru/Ta or Ta/Cu&Al alloy/Ta, with a thickness from 500Å to 1000Å.

18. The method of claim 17, wherein making said oxygen ion-implanted device wafer further comprising having said top electrode layer being patterned and being etched to form electrode line(s).

19. The method of claim 17, wherein making said oxygen ion-implanted device wafer further comprising being annealed between 250 C and 500 C for a time frame from 30 seconds to 30 minutes for activating a metal-oxide bonding and for repairing the device damage(s) during oxygen ion implantation.

* * * * *